United States Patent
Huang et al.

(10) Patent No.: US 6,202,196 B1
(45) Date of Patent: Mar. 13, 2001

(54) METHOD FOR OPTIMIZING ROUTING MESH SEGMENT WIDTH

(75) Inventors: Tammy Huang, Fremont; Wen-Chuan Hsu, Los Altos, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/017,378

(22) Filed: Feb. 3, 1998

(51) Int. Cl.⁷ ............................................. G06F 17/50
(52) U.S. Cl. ............................................. 716/14; 716/13
(58) Field of Search .......................... 395/500.15, 500.14, 395/500.13, 500.12, 500.06, 500.36; 716/14, 13, 11, 5; 203/15

(56) References Cited

U.S. PATENT DOCUMENTS

| | | | |
|---|---|---|---|
| 5,349,542 | * 9/1994 | Brasen et al. | 703/15 |
| 5,404,310 | * 4/1995 | Mitsuhashi | 716/13 |
| 5,568,395 | * 10/1996 | Huang | 716/4 |

\* cited by examiner

*Primary Examiner*—Matthew Smith
*Assistant Examiner*—Vuthe Siek
(74) *Attorney, Agent, or Firm*—Mitchell, Silberberg & Knupp LLP

(57) ABSTRACT

A method for optimizing routing mesh segment widths within limits imposed by voltage drop and metal migration requirements, beginning with an initial mesh comprising a plurality of horizontal segments forming rows and a plurality of vertical segments forming columns. First, a voltage drop and current density associated with each segment is determined. Then a first width for each segment is found by scaling each segment width using a voltage drop scaling factor so that the routing mesh has a maximum voltage drop that satisfies the voltage drop requirement. Next, widths for each segment are determined such that the metal migration requirement minus a margin is satisfied. Then the method ensures that each segment within each row, and each segment within each column, is not more than a first scaling factor wider than its neighboring segments. A second width for each segment is found by ensuring that each segment within each row is not more than a second scaling factor wider than segments at a same vertical position in neighboring rows, and each segment within each column is not more than the second scaling factor wider than segments at a same horizontal position in neighboring columns. The method then selects the larger of the first width and second width for each segment, determines the voltage drop and current density associated with each segment, and checks whether the voltage drop and metal migration requirements are violated. The above steps are repeated if the voltage drop or metal migration requirement is violated.

16 Claims, 3 Drawing Sheets

METHOD FOR OPTIMIZING ROUTING MESH SEGMENT WIDTH

BACKGROUND OF THE INVENTION

1. Field of the Invention

This invention relates to a method for optimizing routing mesh segment width, which is used to maximize routing area for layers of integrated circuits and ensure that voltage drop and metal migration requirements are satisfied.

2. Description of the Related Art

Microelectronic integrated circuits comprise a large number of electronic components which are fabricated on a silicon base or wafer (chip). The design of an integrated circuit transforms a circuit description into a geometric description which is known as a layout. A layout consists of a set of planar geometric shapes in various layers of a silicon chip.

The process of converting electrical circuit specifications into a layout is called the physical design. Physical design involves placing predefined cells and elements in a fixed area, and routing wires between them. The process can be tedious, time consuming, and prone to many errors due to tight tolerance requirements and the minuteness of individual components. Current technology allows fabrication of several million transistors of less than one micron in size on one chip, and future developments are expected to allow fabrication of substantially more components of even smaller size.

Due to the large number of components and the exacting requirements of the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time, and enhanced chip performance. Routing is one phase of the physical design process which can benefit from automation.

Of the several layers fabricated in most integrated circuits, one or more layers typically is a power routing layer. Power routing layers can be thought of as a mesh which comprises horizontal and vertical segments, which are metal interconnections between a power source, ground, and the various cells or circuit elements of the integrated circuit. One problem is that there may be excessive voltage drops across some or all segments; if so, some transistors (typically at the chip's center) may receive insufficient gate voltage to operate properly. Another problem is with metal migration; prolonged continuous current through metal interconnections can cause them to break.

Routing mesh design must deal with these problems. First, the mesh segment widths must be such that the maximum voltage drop for the mesh is no more than a specified voltage drop requirement. Second, the mesh segment widths must be such that a metal migration requirement is met (this requirement is typically set to allow a minimum chip lifespan of around ten years without breaking of segments). Segment width must be designed to satisfy both the voltage drop and metal migration requirements. Due to the complexity of this problem, a design method suitable for automation is needed. Additionally, it is desirable to minimize the width, and thus area, of mesh segments so that the routing area of the layer is maximized.

Therefore, it is an object of this invention to provide a method for optimizing a routing mesh such that segment width is minimized while complying with a set of limitations such as voltage drop and metal migration requirements.

SUMMARY OF THE INVENTION

This object is achieved by the present invention, which comprises a method for optimizing routing mesh segment widths within limits imposed by voltage drop and metal migration requirements, beginning with an initial mesh comprising a plurality of horizontal segments forming rows and a plurality of vertical segments forming columns. The method comprises the following steps: First, a voltage drop and current density associated with each segment is determined. Then a first width for each segment is found by scaling each segment width using a voltage drop scaling factor so that the routing mesh has a maximum voltage drop that satisfies the voltage drop requirement.

Next, widths for each segment are determined such that the metal migration requirement minus a margin is satisfied. Then the method ensures that each segment within each row, and each segment within each column, is not more than a first scaling factor wider than its neighboring segments. A second width for each segment is found by ensuring that each segment within each row is not more than a second scaling factor wider than segments at a same vertical position in neighboring rows, and each segment within each column is not more than the second scaling factor wider than segments at a same horizontal position in neighboring columns. In alternative preferred versions, the step of finding a first width could follow the step of finding a second width, or could be performed in parallel with the step of finding a second width.

After the above steps have been performed, the method selects the larger of the first width and second width for each segment, determines the voltage drop and current density associated with each segment, and checks whether the voltage drop and metal migration requirements are violated. Finally, the above steps are repeated if the voltage drop or metal migration requirement is violated.

In a preferred version of the method of the present invention, the voltage drop scaling factor takes into account different voltage drop requirements for different megacells by being the maximum of an overall factor and different factors for different megacells.

With respect to the metal migration requirement, in a preferred version of the present invention, the first scaling factor is about 1.1, the second scaling factor is about 1.2, and it is assumed that current remains unchanged within each particular iteration.

These and other aspects, features, and advantages of the present invention will be apparent to those persons having ordinary skill in the art to which the present invention relates from the foregoing description and the accompanying drawings.

DESCRIPTION OF THE PREFERRED EMBODIMENTS

A. Overview

Figure 2:
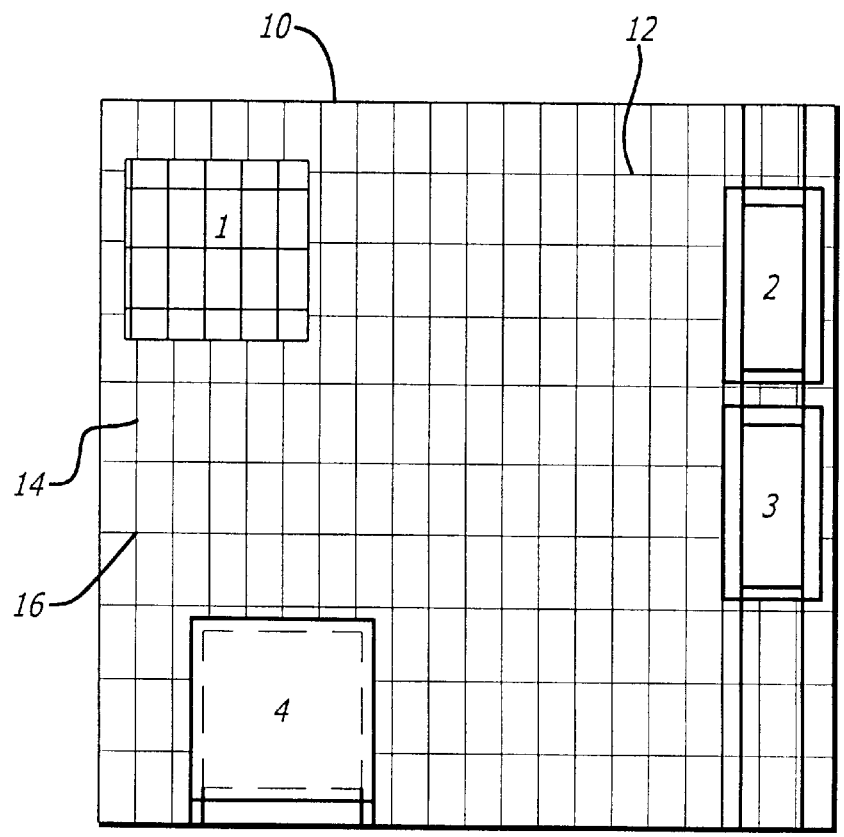
FIG. 2 is an overhead view of a routing mesh.

Integrated circuits comprise a silicon base which has a plurality of circuit elements (components) and associated interconnections fabricated thereon. The silicon base is typically contained in a package that has a plurality of contacts which provide external output and input connections for the components. Of the several layers fabricated in most integrated circuits, one or more layers typically is a power routing layer. As is shown by FIG. 2, power routing layers can be thought of as a mesh 10 which comprises horizontal segments 12 and vertical segments 14, which are metal interconnections between a power source, or ground, and the various cells or circuit elements of the integrated circuit. Horizontal segments 12 and vertical segments 14 are typically placed on separate, adjacent layers and connected with vias to form mesh intersections 16. In practice, one set of horizontal segments 12 and vertical segments 14 may be used to supply power source, and another for ground. Routing mesh design must take into account the following considerations. First, the mesh segment widths must be such that the maximum voltage drop for the mesh is no more than a specified voltage drop requirement. Second, the mesh segment widths must be such that a metal migration requirement is met.

Figure 1:
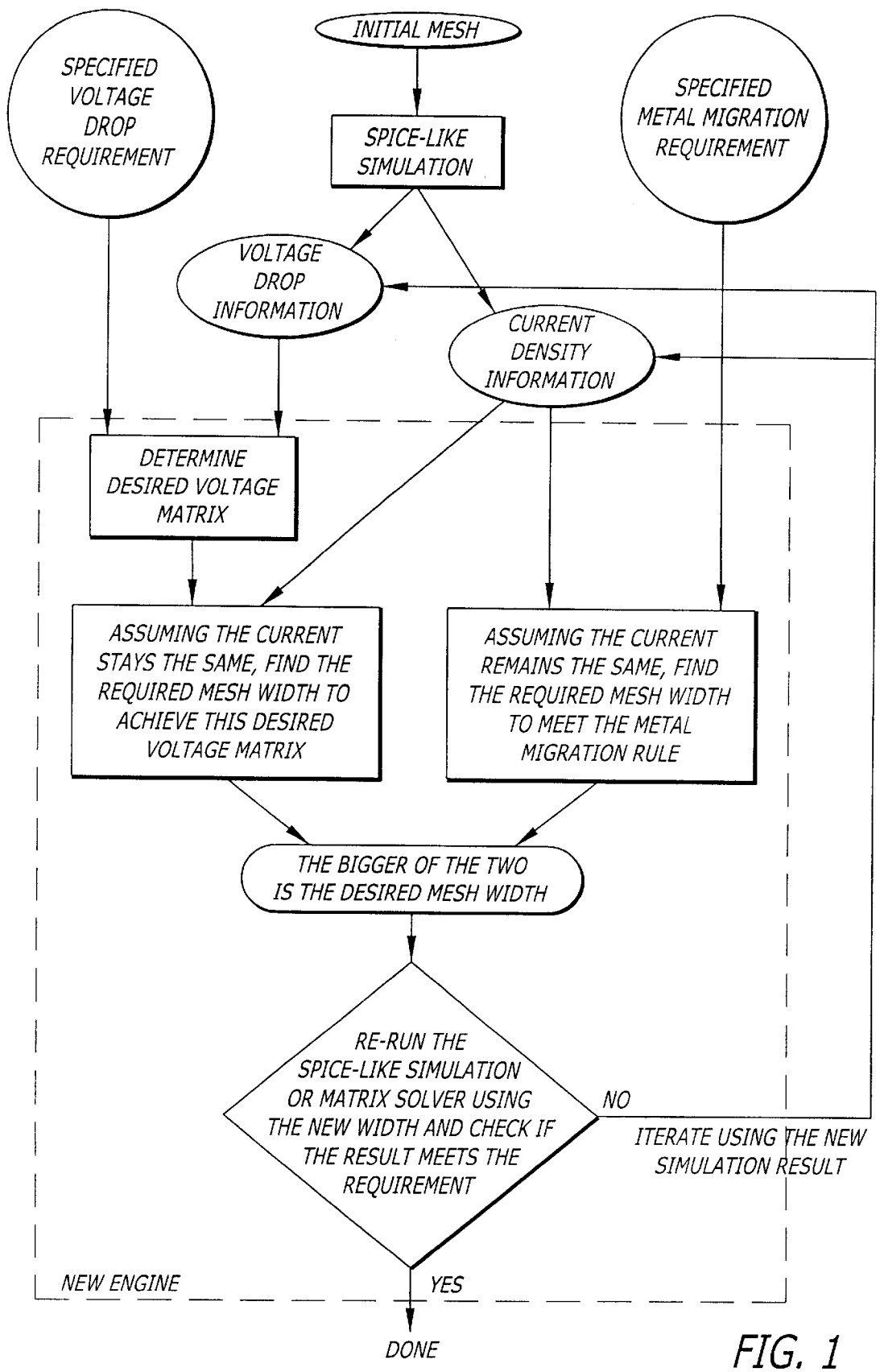
FIG. 1 is a flowchart of a preferred version of the present invention.

As is shown by the flowchart of FIG. 1, the method of the present invention uses an iterative procedure: Given an initial mesh, the method successively improves it over a number of repeated steps or iterations. Segment widths for the initial mesh are estimated based upon criteria well known to those skilled in the art, such as typical width for the particular chip size chosen, and power dissipation.

Figure 3:
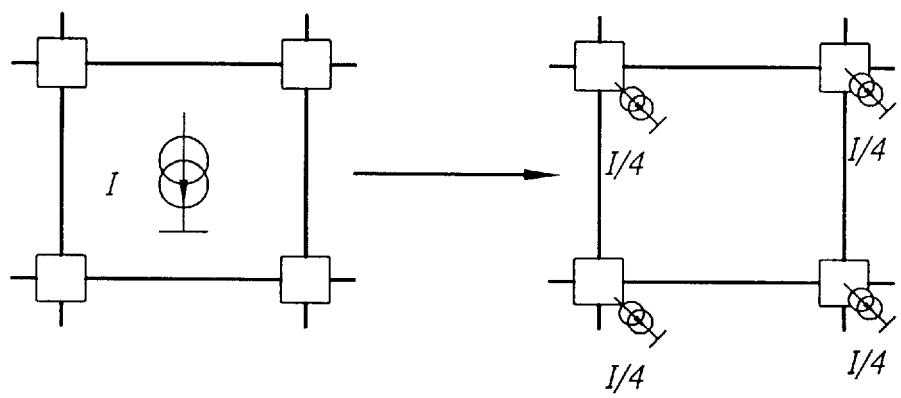
FIG. 3 is a diagram of current division for purposes of simulation.

An initial voltage drop and current density are calculated for each segment using a circuit simulation software tool such as SPICE (which is in the public domain), or one of its commercial variants. Current I in FIG. 3 represents the sum of current from cells that are located within that specific box in the mesh. For purposes of the simulation, the current I is divided as shown in FIG. 3.

Two major optimization procedures are performed by the method of the present invention. First, the method determines the mesh trace segment widths which satisfy voltage drop requirements. Second, the method determines the mesh trace segment widths which satisfy the metal migration requirements. Then, the larger of the two widths for each trace segment is chosen as the final width for that trace segment.

B. Satisfying the Voltage Drop Requirement

Given a voltage drop requirement, the method of the present invention first locates the minimum voltage drop of the mesh, and then determines a scale factor which is needed to scale that maximum voltage drop so that the voltage drop requirement is satisfied. Let $V_{dd}$ be the voltage supply, $V_{drop}$ be the voltage drop requirement, and $V_{min}$ be the minimum voltage in the initial mesh. Then the scale factor is defined as follows:

$$\text{factor} = \frac{(V_{dd} - V_{drop})}{(V_{dd} - V_{min})}$$

Based on this factor, let $V_o$ be the original voltage at any intersection of mesh trace segments; then we defined the desired voltage at every node, $V_d$, in the mesh as:

$$V_d = V_{dd} - (V_{dd} - V_o) \times \text{factor}$$

Let newwidth be the new width for a mesh trace segment, oldwidth be the original width for the mesh trace segment, $R_o$ be the old resistance value, and $R_d$ be the desired resistance associated with newwidth. Since resistance is inversely proportional to metal width, the new width is determined as:

$$newwidth = oldwidth \times (R_o)/(R_d)$$

Let $V_{O1}$ and $V_{O2}$ be the original voltages at any two ends of the mesh trace segment, and $V_{d1}$ and $V_{d2}$ be the desired voltages we calculated in using the scaling factor associated with these two node voltages, and oldcurrent be the original current flowing in this trace segment, and newcurrent be the new current flowing in this trace segment after width has changed. Replacing resistance with voltage current ratio, we have:

$$newwidth = oldwidth \times \frac{(V_{o1} - V_{o2})}{oldCurrent} \times \frac{newCurrent}{V_{d1} - V_{d2}}$$

An approximation employed by a preferred version of the present invention is that segment current remains unchanged within each particular iteration. This approximation is quite reasonable; in tests of the present method, typically only one iteration was required to satisfy the voltage drop requirement. Since it is assumed that the current remains unchanged, oldcurrent is equal to newcurrent. Using the voltage equation given earlier, we can transform the above equation as follows:

$$newwidth = oldwidth \times \frac{(V_{o1} - V_{o2})}{V_{dd} - (V_{dd} - V_{o1}) \times \text{factor} - (V_{dd} - (V_{dd} - V_{o2}) \times \text{factor})}$$

Thus, the new mesh width is given as:

$$newwidth = \frac{oldwidth}{\text{factor}}$$

Integrated circuits typically include megacells, which are large circuit blocks that cover more than one mesh box, as is shown in FIG. 2 by megacells 1–4. Different megacells can have different voltage drop requirements. If there are different voltage drop requirements for different megacells, the determination of the desired voltage at every node must be modified.

A preferred version of the present method deals with this problem. Let $V_{d0}$ be the desired voltage for the overall chip, $V_{d1}, \ldots, V_{dn}$ be different voltage drop requirements for different megacells at different locations respectively, $V_{min0}$ be the associated minimum voltage for the overall chip, and $V_{min1}, \ldots, V_{minn}$ be the associated minimum voltage at each of the megacell locations. Then the corresponding factor associated with each different megacell's voltage drop requirement is given below:

$$\text{factor}_i = \frac{(V_{dd} - V_d)}{(V_{dd} - V_{\min})}$$

The factor corresponding to overall chip voltage drop requirement is:

$$\text{factor}_o = \frac{(V_{dd} - V_d)}{(V_{dd} - V_{\min})}$$

The final factor is obtained as:

$$\text{factor}_{final} = \max(\text{factor}_1, \ldots, \text{factor}_n, \text{factor}_o)$$

Applying this factor to every node of the mesh as before:

$$V_d = V_{dd} - (V_{dd} - V_o) \times \text{factor}_{final}$$

The new mesh width is given below:

$$\text{newwidth} = \frac{\text{oldwidth}}{\text{factor}_{final}}$$

C. Satisfying the Metal Migration Requirement

After widths satisfying the voltage drop requirements are determined, another set of widths satisfying the metal migration requirement are determined. The metal migration requirement is typically specified in milliamps per square micrometer. However, this can be simplified to milliamps per micrometer of segment width, for example, 2.4 ma/um, where the height of segment cross-sections is predetermined for particular technologies. Segments that satisfy the metal migration requirement will not fail (break due to electromigration) for some specified period, such as ten years, determined according to principles well-known to those skilled in the art. The metal migration requirement essentially requires that each metal mesh segment should be wide enough so that the current density for that segment is below the metal migration limit set for the particular technology under consideration. However, simply changing the width of the segments that violate the requirement is insufficient; this often creates new violations on neighboring segments.

The method of the present invention avoids this problem by using a heuristic procedure which uses two scaling factors to make sure that there is no dramatic change in segment width within or between vertical columns or horizontal rows of segments. By way of example and not of limitation, the first scaling factor could be set to 1.1 and thus limit changes in width within a column or row so that any segment within the column or row cannot be more than 1.1 times wider than its immediately neighboring segments. The second scaling factor could be set to 1.2, and is used to limit changes in width between neighboring columns, and also between neighboring rows. Consequently, the method of the present invention produces gradual changes in column and row width. For best results, the first scaling factor is always applied before the second scaling factor.

As was noted above, a preferred version of the present invention uses the approximation that current remains the same within each iteration. Since the metal migration requirement is directly related to current, it is much more sensitive to current changes than the method step which deals with the voltage drop requirement. Therefore, in order to reduce the number of iterations required for convergence, the method of the present invention builds in a margin for the metal migration requirement. A heuristic parameter is introduced as a margin which is to be subtracted from the metal migration requirement. By way of example and not of limitation, this parameter can be set to 0.2 ma/um. For example, if the metal migration requirement is 2.4 ma/um, then the method will actually use 2.2 ma/um as the limit.

Figure 4:
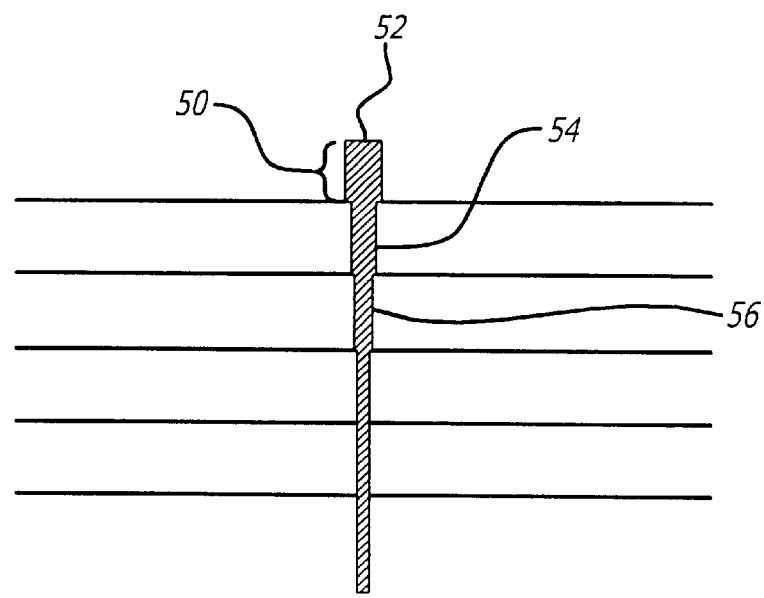
FIG. 4 is a diagram showing how a first scaling factor is applied.
Figure 5:
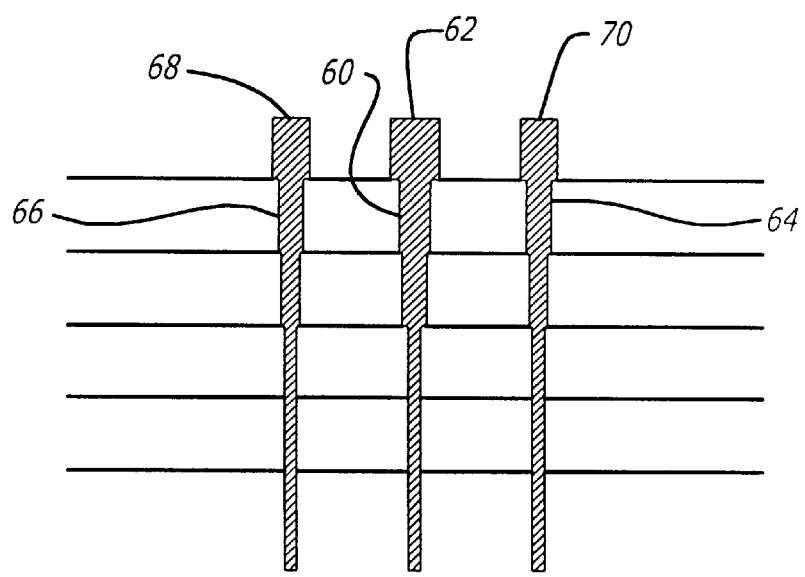
FIG. 5 is a diagram showing how a second scaling factor is applied.

The method steps used in determining widths which satisfy the metal migration requirement are as follows. First, information regarding the initial mesh current density is used to determine a width sufficient to satisfy the metal migration requirement minus the margin. Next, as is shown in FIG. 4, using a first scaling factor of 1.1, for example, the method performs calculations for each segment 50 within a column 52 or row to ensure that each segment 50 cannot be more than 1.1 times wider than its immediately neighboring segments 54, 56 within that column 52 or row. This is repeated for every column and then every row, or vice-versa. Next, as is shown in FIG. 5, using a second scaling factor of 1.2, for example, the method performs calculations for each segment 60 within a column 62 to ensure that each segment 60 cannot be more than 1.2 times wider than segments 64, 66 at the same vertical position in neighboring columns 68, 70 (on either side of the column at issue). Similarly, the method performs calculations for each segment within a row to ensure that each segment cannot be more than 1.2 times wider than segments at the same horizontal position in neighboring rows. This is repeated for every column and then every row, or vice-versa.

At this point, two major optimization procedures have been performed by the method of the present invention. First, segment widths satisfying the voltage drop requirement were determined. Second, segment widths satisfying the metal migration requirement were determined. Alternatively, the metal migration requirement calculations could be performed before the voltage drop requirement calculations, or both sets of calculations could be performed in parallel.

Next, the larger of the two widths for each segment is chosen as the final width for that segment. A circuit simulation is then run to calculate voltage drops and current densities for each segment. If the voltage drop and metal migration requirements are satisfied, the process has been successfully completed. Otherwise, another iteration is needed.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A method for optimizing routing mesh segment widths within limits imposed by voltage drop and metal migration requirements, beginning with an initial mesh comprising a plurality of horizontal segments forming rows and a plurality of vertical segments forming columns, said method comprising the steps of:

finding a first width for each segment of the routing mesh so that the routing mesh has a maximum voltage drop that satisfies a voltage drop requirement;

finding a second width for each segment of the routing mesh by determining a width for said each segment such that a metal migration requirement is satisfied;

ensuring that each segment which is disposed within a row is not wider than a width calculated by multiplying a first scaling factor with a width of its neighboring segments in said row, and each segment which is disposed within a column is not wider than a width calculated by multiplying the first scaling factor with a width of its neighboring segments in said column;

selecting the larger of the first width and second width for each segment;

determining a voltage drop and a current density associated with each segment;

determining whether the voltage drop and the metal migration requirements are violated; and repeating the above steps until the voltage drop and the metal migration requirements are satisfied.

2. The method of claim 1, wherein the first width for each segment is found by scaling each segment width using a voltage drop scaling factor, and wherein the voltage drop scaling factor takes into account different voltage drop requirements for different megacells.

3. The method of claim 2, wherein the voltage drop scaling factor is the maximum of an overall factor and different factors for different megacells.

4. The method of claim 1, wherein the step of finding a first width follows the step of finding a second width.

5. The method of claim 1, wherein the step of finding a first width is performed in parallel with the step of finding a second width.

6. The method of claim 1, wherein it is assumed that current remains unchanged within each particular iteration.

7. The method of claim 1, wherein said step of ensuring comprises:

ensuring that said each segment which is disposed within a column is not wider than a width calculated by multiplying a second scaling factor with a width of segments in neighboring columns and each segment which is disposed within a row is not wider than a width calculated by multiplying a second scaling factor with a width of segments in neighboring rows.

8. The method of claim 7, wherein the first scaling factor is about 1.1.

9. The method of claim 7, wherein the second scaling factor is about 1.2.

10. The method of claim 1, wherein said step of ensuring comprises:

ensuring that said each segment which is disposed within a column is not wider than a width calculated by multiplying a second scaling factor with a width of segments in neighboring columns at the same vertical position as said each segment and each segment which is disposed within a row is not wider than a width calculated by multiplying a second scaling factor with a width of segments in neighboring rows at the same horizontal position as said each segment.

11. The method of claim 1, wherein the first width for each segment is found by scaling each segment width using a voltage drop scaling factor.

12. The method of claim 1, wherein said step of finding the second width includes a substep of determining the width for said each segment such that the metal migration requirement is satisfied by an additional margin.

13. The method of claim 12, wherein the metal migration requirement is specified as a maximum current density, and wherein said substep includes determining the width for said each segment such that the current density through said each segment is less than a quantity equal to the metal migration requirement minus the additional margin.

14. The method of claim 13, wherein the additional margin is selected to account for current variation during a single iteration of the steps recited in claim 1.

15. An apparatus for optimizing routing mesh segment widths within limits imposed by voltage drop and metal migration requirements, beginning with an initial mesh comprising a plurality of horizontal segments forming rows and a plurality of vertical segments forming columns, said apparatus comprising:

means for finding a first width for each segment of the routing mesh so that the routing mesh has a maximum voltage drop that satisfies a voltage drop requirement;

means for finding a second width for each segment of the routing mesh by determining a width for said each segment such that a metal migration requirement is satisfied;

means for ensuring that each segment which is disposed within a row is not wider than a width calculated by multiplying a first scaling factor with a width of its neighboring segments in said row, and each segment which is disposed within a column is not wider than a width calculated by multiplying the first scaling factor with a width of its neighboring segments in said column;

means for selecting the larger of the first width and second width for each segment;

means for determining a voltage drop and a current density associated with each segment;

means for determining whether the voltage drop and the metal migration requirements are violated; and means for repeating the above steps until the voltage drop and the metal migration requirements are satisfied.

16. A computer-readable medium storing computer-executable process steps for optimizing routing mesh segment widths within limits imposed by voltage drop and metal migration requirements, beginning with an initial mesh comprising a plurality of horizontal segments forming rows and a plurality of vertical segments forming columns, said process steps comprising steps to:

find a first width for each segment of the routing mesh so that the routing mesh has a maximum voltage drop that satisfies a voltage drop requirement;

find a second width for each segment of the routing mesh by determining a width for said each segment such that a metal migration requirement is satisfied;

ensure that each segment which is disposed within a row is not wider than a width calculated by multiplying a first scaling factor with a width of its neighboring segments in said row, and each segment which is disposed within a column is not wider than a width calculated by multiplying the first scaling factor with a width of its neighboring segments in said column;

select the larger of the first width and second width for each segment;

determine a voltage drop and a current density associated with each segment;

determine whether the voltage drop and the metal migration requirements are violated; and repeat the above steps until the voltage drop and the metal migration requirements are satisfied.

* * * * *